United States Patent
Holmberg et al.

(10) Patent No.: US 7,179,093 B2
(45) Date of Patent: Feb. 20, 2007

(54) RETRACTABLE LEDGE SOCKET

(75) Inventors: Nicholas L. Holmberg, Gilbert, AZ (US); John J. Beatty, Chandler, AZ (US); Pramod Malatkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/174,074

(22) Filed: Jun. 30, 2005

(65) Prior Publication Data

US 2007/0004246 A1    Jan. 4, 2007

(51) Int. Cl.
 *H01R 13/62* (2006.01)
(52) U.S. Cl. .......................................... 439/73; 439/331
(58) Field of Classification Search .................. 439/73, 439/331, 266, 71
 See application file for complete search history.

(56) References Cited

U.S. PATENT DOCUMENTS

| | | | | |
|---|---|---|---|---|
| 5,288,240 A | * | 2/1994 | Savant | ........................ 439/266 |
| 5,290,193 A | * | 3/1994 | Goff et al. | ................... 439/331 |
| 5,833,471 A | * | 11/1998 | Selna | ........................... 439/73 |
| 6,749,443 B2 | * | 6/2004 | Sano et al. | ................... 439/71 |
| 6,848,928 B2 | * | 2/2005 | Ikeya et al. | ................... 439/331 |
| 6,863,553 B2 | * | 3/2005 | Watanabe | ..................... 439/330 |
| 6,870,251 B2 | | 3/2005 | Tran | |

OTHER PUBLICATIONS

U.S. Appl. No. 11/173,697; Title:Socket Features for Aligning and Orienting Components; Inventor: Vinayak Panday; filed Jun. 30, 2005.
U.S. Appl. No. 10/973,328; Title:Protected Socket for Integrated Circuit Devices; Inventor: Hong Xie; filed Oct. 25, 2004.

* cited by examiner

*Primary Examiner*—Gary F. Paumen
(74) *Attorney, Agent, or Firm*—David L. Gugliemi

(57) ABSTRACT

In some embodiments, a retractable ledge socket is presented. In this regard, a socket ledge is introduced to receive a processor, and to reposition to allow the processor to contact socket connections. Other embodiments are also disclosed and claimed.

11 Claims, 4 Drawing Sheets

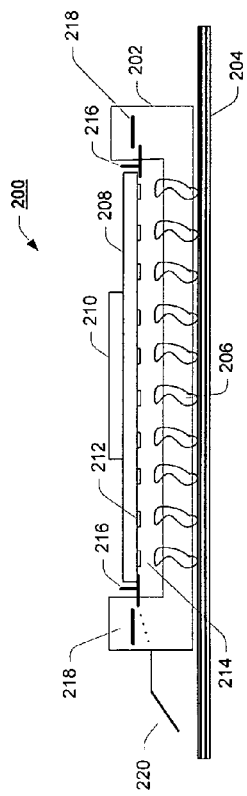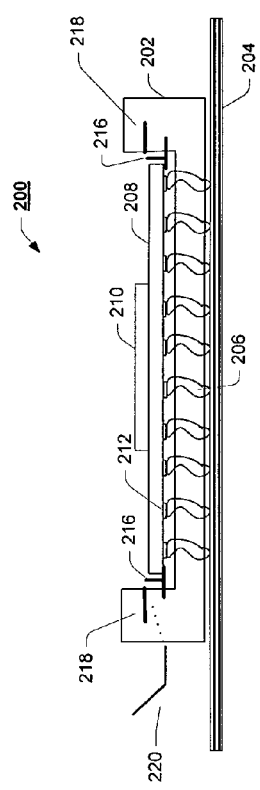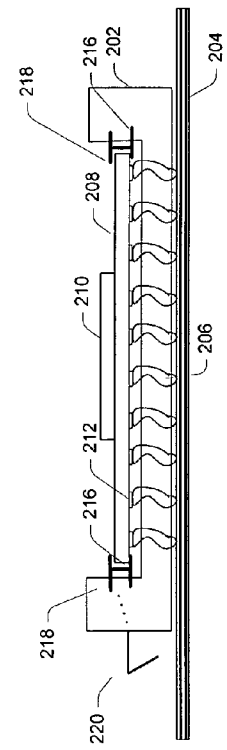

RETRACTABLE LEDGE SOCKET

FIELD OF THE INVENTION

Embodiments of the present invention generally relate to the field of sockets, and, more particularly to a retractable ledge socket.

BACKGROUND OF THE INVENTION

In computing devices, processors are generally placed by hand in sockets which are soldered onto a substrate. In some cases, a person who places a processor in a socket incorrectly or with too much force can cause damage to the processor package or the socket connections that may require the processor or motherboard to be replaced. Damage to processors and sockets can be costly and time consuming to a computer manufacturing operation.

BRIEF DESCRIPTION OF THE DRAWINGS

The present invention is illustrated by way of example and not limitation in the figures of the accompanying drawings in which like references indicate similar elements, and in which:

FIGS. 2A–2C are cross-sectional views of an example retractable ledge socket, in accordance with one example embodiment of the invention;

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1A:
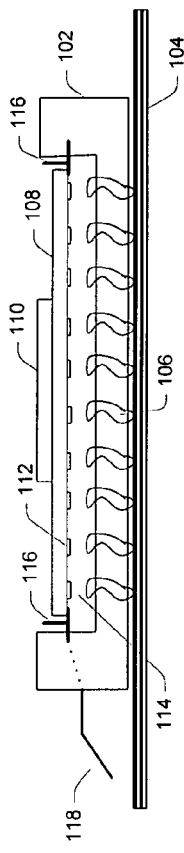
FIGS. 1A–1C are cross-sectional views of an example retractable ledge socket, in accordance with one example embodiment of the invention.
Figure 1B:
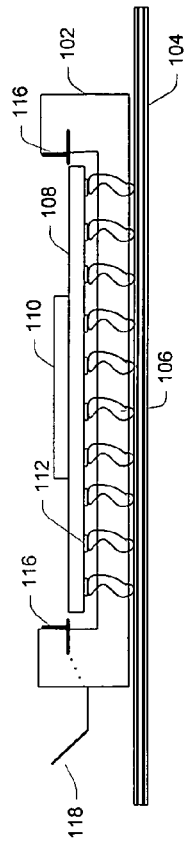
Figure 1C:
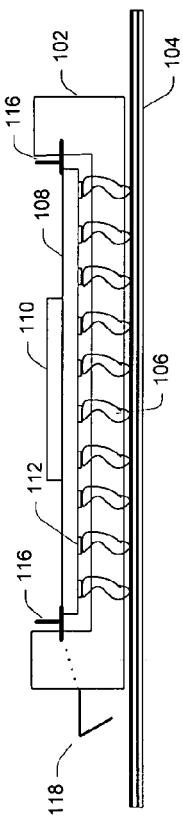

FIGS. 1A–1C are cross-sectional views of an example retractable ledge socket, in accordance with one example embodiment of the invention. In accordance with the illustrated example embodiment, processor socket 100 may include socket body 102, substrate 104, socket connections 106, processor package 108, processor 110, processor contacts 112, vertical space 114, socket ledge 116, and socket lever 118 coupled as shown in FIG. 1A.

Socket body 102 is usually made of plastic and provides the structural support and protection for internal mechanisms of the socket, for example socket connections 106.

Substrate 104 is typically a fiberglass board that includes embedded interconnections to connect components, for example to connect the processor socket with a chipset. In one embodiment, substrate 104 is a system motherboard.

Socket connections 106, when in contact with processor contacts 112, electrically couple processor 110 to signals embedded in substrate 104. While shown as being vertically aligned, socket connections 106 may diverge within socket body 102 and couple with substrate 104 at point not directly below processor contacts 112.

Processor package 108, which is coupled with processor 110, provides stability and protection for processor contacts 112.

Processor 110 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect.

Processor contacts 112 are the electrical and logical inputs and outputs of processor 110 that enable its functionality. In one embodiment, processor contacts 112 are land grid array (LGA) metal connections.

Vertical space 114 is the distance processor contacts 112 are suspended above socket connections 106. Vertical space 114 provides a buffer to protect processor contacts 112 and socket connections 106 from damage by manual insertion of the processor.

Socket ledge 116 is the mechanical means for suspending processor package 108 above socket connections 106. In one embodiment, socket ledge 116 is designed so that it guides insertion of the processor and only contacts the outside edges on the bottom of processor package 108. Socket ledge 116 is also capable of being repositioned as described hereinafter.

Socket lever 118 is mechanically coupled to socket ledge 116 and provides a means for repositioning socket ledge 116. Socket lever 118 may include an arm, a spring-loaded switch, or any other known mechanism for affecting the position of socket ledge 116.

FIG. 1B depicts the repositioning of socket ledge 116. In one embodiment, socket lever 118 is actuated and mechanically repositions socket ledge 116. As depicted, socket ledge 116 moves outward causing processor package 108 to drop down and allowing processor contacts 112 to couple with socket connections 106.

FIG. 1C depicts an example of further repositioning of socket ledge 116. Socket lever 118 may be moved into a third position, although it may also be returned to the previous position, causing socket ledge 116 to reposition and contact the top surface of processor package 108, thereby holding processor package 108 in place.

FIGS. 2A–2C are cross-sectional views of an example retractable ledge socket, in accordance with one example embodiment of the invention. In accordance with the illustrated example embodiment, processor socket 200 may include socket body 202, substrate 204, socket connections 206, processor package 208, processor 210, processor contacts 212, vertical space 214, socket ledge 216, socket lid 218, and socket lever 220 coupled as shown in FIG. 2A FIG. 2B depicts the repositioning of socket ledge 216 and socket lid 218. A mechanical input to socket lever 220 causes socket ledge 216 to move downward and socket lid

218 to move inward. In this way, processor contacts 212 are lowered through the vertical space 214 until they contact socket connections 206.

FIG. 2C depicts an example of further repositioning of socket ledge 216 and socket lid 218. Further manipulation of socket lever 220 causes socket lid 218 to move inward over the top surface of processor package 208, helping to hold processor package 208 in place. It should be noted that moving socket lever 220 in the opposite direction would have the effect of moving socket lid 218 outward and moving socket ledge 216 upward, thereby removing processor contacts 212 from contact with socket connections 206.

Figure 3A:
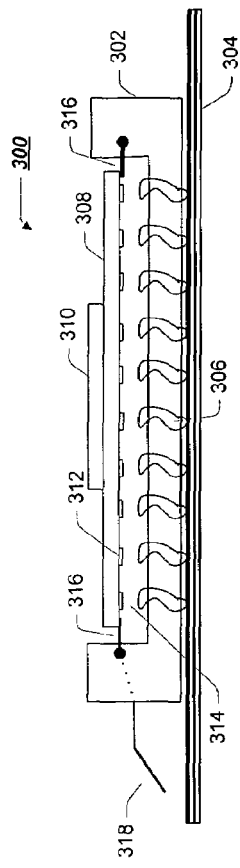
FIGS. 3A–3C are cross-sectional views of an example retractable ledge socket, in accordance with one example embodiment of the invention.
Figure 3B:
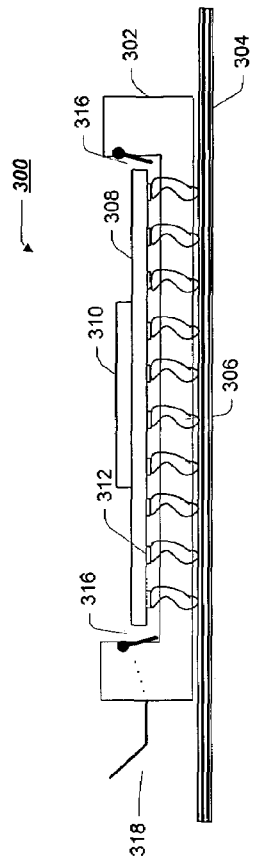
Figure 3C:
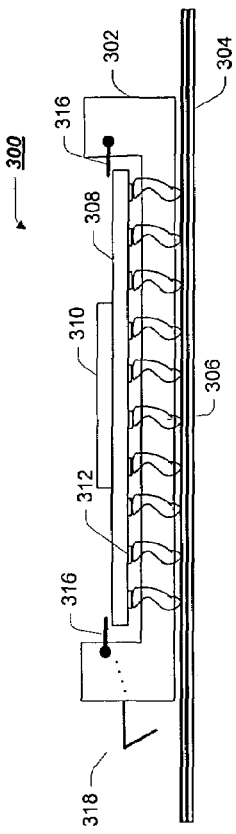

FIGS. 3A–3C are cross-sectional views of an example retractable ledge socket, in accordance with one example embodiment of the invention. In accordance with the illustrated example embodiment, processor socket 300 may include socket body 302, substrate 304, socket connections 306, processor package 308, processor 310, processor contacts 312, vertical space 314, socket ledge 316, and socket lever 318 coupled as shown in FIG. 3A.

FIG. 3B depicts the repositioning of socket ledge 316. In this example embodiment, a user input to socket lever 318 causes, through mechanical coupling not shown, socket ledge 316 to rotate downward and outward, which causes processor package 308 to drop down onto socket connections 306.

FIG. 3C depicts an example of further repositioning of socket ledge 316. Further manipulation of socket lever 318 causes socket ledge 316 to complete the rotation and contact the top surface of processor package 308, thereby helping to hold it in place. It should be noted that moving socket lever 318 in the opposite direction would cause socket ledge 316 to rotate in the opposite direction and thereby lift processor package 308 up away from socket connections 306.

Figure 4:
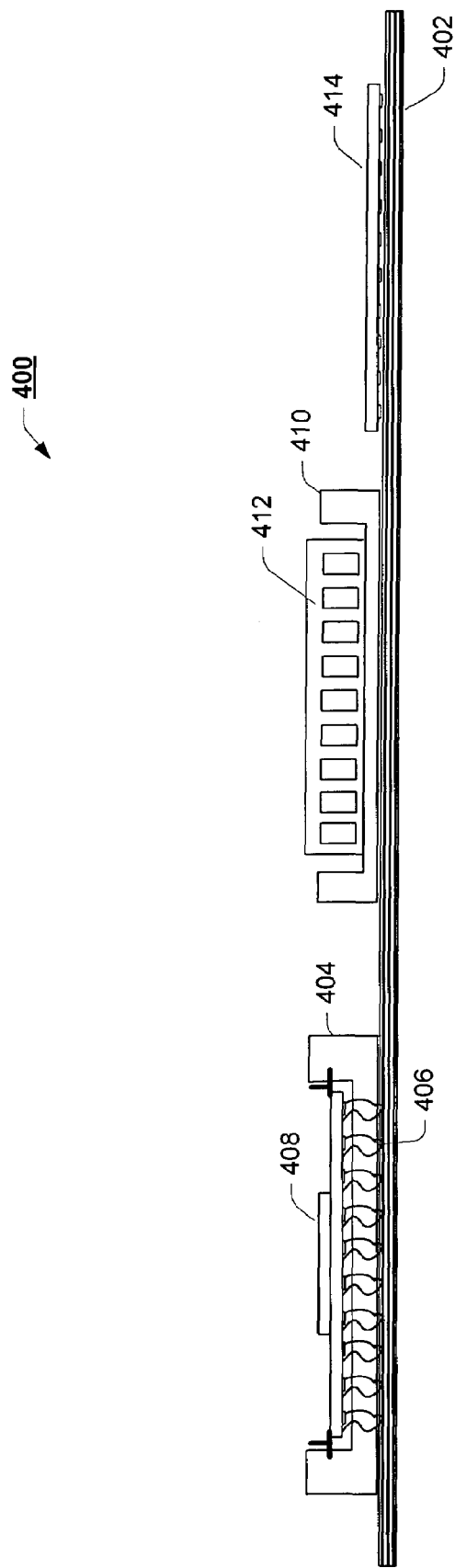
FIG. 4 is a cross-sectional view of an example electronic appliance incorporating a retractable ledge socket, in accordance with one example embodiment of the invention.

FIG. 4 is a cross-sectional view of an example electronic appliance incorporating a retractable ledge socket, in accordance with one example embodiment of the invention. Electronic appliance 400 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 400 may include substrate 402, processor socket 404, socket connections 406, processor 408, memory socket 410, memory module 412, and network controller 414 coupled as shown in FIG. 4.

Substrate 402 may be a fiberglass motherboard with components soldered to it. For example, socket connections 406, memory socket 410 and network controller 414 may be soldered to a surface of substrate 402. Conductive elements, either on a surface of or embedded within substrate 402, provide the means for electrically coupling the various components with one another.

Processor socket 404 may include a retractable socket ledge as depicting in FIG. 1, 2, or 3.

Processor 408 may have been manufactured by Intel Corporation, and may have been seated in processor socket 404 by a method depicted in FIG. 1, 2, or 3.

Memory module 412 may represent any type of memory device(s) used to store data and instructions that may have been or will be used by processor 408. Typically, though the invention is not limited in this respect, memory module 412 will consist of dynamic random access memory (DRAM). In one embodiment, memory module 412 may consist of Rambus DRAM (RDRAM). In another embodiment, memory module 412 may consist of double data rate synchronous DRAM (DDRSDRAM). The present invention, however, is not limited to the examples of memory mentioned here.

Network controller 414 may represent any type of device that allows electronic appliance 400 to communicate with other electronic appliances or devices. In one embodiment, network controller 414 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 414 may be an Ethernet network interface card.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. A method comprising:
   receiving a processor on a socket ledge;
   actuating a socket lever mechanically coupled with the ledge, thereby repositioning the ledge to cause the processor to contact socket connections; and
   further actuating the socket lever, thereby repositioning the ledge to hold the processor in contact with the socket connections.

2. The method of claim 1, wherein repositioning the ledge to cause the processor to contact socket connections comprises:
   retracting the ledge to cause the processor to fall onto the socket connections.

3. The method of claim 1, wherein repositioning the ledge to cause the processor to contact socket connections comprises:
   lowering the ledge to seat the processor onto the socket connections.

4. The method of claim 3, further comprising:
   raising the ledge to unseat the processor from the socket connections.

5. An electronic appliance, comprising:
   a processor, to process data;
   a memory, to store data;
   a network controller, to communicate data; and
   a processor socket coupled with the processor, the memory and the network controller, the processor socket comprising a socket ledge to receive the processor, and a socket lever mechanically coupled to the socket ledge capable of causing the socket ledge to reposition to cause the processor to contact socket connections, the socket ledge to further reposition to hold the processor in contact with the socket connections.

6. The electronic appliance of claim 5, wherein the socket ledge to further reposition to hold the processor in contact with the socket connections comprises:
   a first surface to receive the processor, and
   a second surface to hold the processor.

7. The electronic appliance of claim 5, wherein the socket ledge to reposition to cause the processor to contact socket connections comprises:

the socket ledge to retract to cause the processor to fall onto the socket connections.

8. A processor socket comprising:

socket connections, to couple with a processor;

a lever, to activate a socket ledge; and the socket ledge, to receive a processor above the socket connections and to reposition to cause the processor to contact the socket connections and to further reposition to hold the processor in contact with the socket connections.

9. The processor socket of claim 8, further comprising the socket ledge to further reposition to remove the processor from contact with the socket connections.

10. The processor socket of claim 8, wherein the socket ledge to reposition to cause the processor to contact the socket connections comprises the socket ledge to retract to cause the processor to drop onto the socket connections.

11. The processor socket of claim 8, wherein the socket ledge to reposition to cause the processor to contact the socket connections comprises the socket ledge to lower to seat the processor onto the socket connections.

* * * * *